(12) United States Patent
Yasuda et al.

(10) Patent No.: US 10,453,732 B2
(45) Date of Patent: Oct. 22, 2019

(54) WAFER LAMINATE AND MAKING METHOD

(71) Applicant: SHIN-ETSU CHEMICAL CO., LTD., Tokyo (JP)

(72) Inventors: Hiroyuki Yasuda, Annaka (JP); Michihiro Sugo, Annaka (JP); Hideto Kato, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 355 days.

(21) Appl. No.: 15/360,418

(22) Filed: Nov. 23, 2016

(65) Prior Publication Data
US 2017/0154802 A1    Jun. 1, 2017

(30) Foreign Application Priority Data

Nov. 26, 2015  (JP) ................. 2015-230407

(51) Int. Cl.
*H01L 21/683* (2006.01)
*H01L 21/304* (2006.01)
(Continued)

(52) U.S. Cl.
CPC .......... *H01L 21/6836* (2013.01); *C08G 77/52* (2013.01); *C08K 5/0025* (2013.01); *C08L 63/00* (2013.01); *C09D 5/32* (2013.01); *C09D 165/00* (2013.01); *C09D 183/14* (2013.01); *C09J 5/00* (2013.01); *C09J 165/00* (2013.01); *C09J 183/14* (2013.01); *H01L 21/304* (2013.01); *H01L 21/6835* (2013.01); *H01L 24/14* (2013.01); *C09J 2203/326* (2013.01); *H01L 2221/6834* (2013.01); *H01L 2221/68327* (2013.01);
(Continued)

(58) Field of Classification Search
CPC ........................................ H01L 21/6835–6836
See application file for complete search history.

(56) References Cited

U.S. PATENT DOCUMENTS 6,465,330 B1 * 10/2002 Takahashi ............... B24B 37/04
428/343
2003/0064305 A1    4/2003 Ono et al.
(Continued)

FOREIGN PATENT DOCUMENTS

EP    2 551 322 A1    1/2013
EP    2 738 797 A2    6/2014
(Continued)

OTHER PUBLICATIONS

Machine Translation of JP2012-224062A. Nov. 15, 2012. (Year: 2012).*
(Continued)

*Primary Examiner* — Stephen E Rieth
(74) *Attorney, Agent, or Firm* — Westerman, Hattori, Daniels & Adrian, LLP

(57) ABSTRACT

A wafer laminate has an adhesive layer (3) sandwiched between a transparent substrate (1) and a water (2), with a circuit-forming surface of the wafer facing the adhesive layer. The adhesive layer (3) includes a first cured resin layer (3a) disposed adjacent the substrate and having light-shielding properties and a second cured resin layer (3b) disposed adjacent the wafer and comprising a cured product of a thermosetting resin composition.

10 Claims, 1 Drawing Sheet

(51) Int. Cl.
  *H01L 23/00*   (2006.01)
  *C09J 165/00*  (2006.01)
  *C09J 183/14*  (2006.01)
  *C09D 5/32*    (2006.01)
  *C09D 165/00*  (2006.01)
  *C09D 183/14*  (2006.01)
  *C09J 5/00*    (2006.01)
  *C08G 77/52*   (2006.01)
  *C08K 5/00*    (2006.01)
  *C08L 63/00*   (2006.01)

(52) U.S. Cl.
  CPC ........... *H01L 2221/68386* (2013.01); *H01L 2224/13147* (2013.01); *H01L 2924/0715* (2013.01); *H01L 2924/0782* (2013.01); *H01L 2924/15788* (2013.01); *H01L 2924/3511* (2013.01); *H01L 2924/3512* (2013.01)

(56) References Cited

U.S. PATENT DOCUMENTS

| | | |
|---|---|---|
| 2007/0098995 A1 | 5/2007 | Masuko et al. |
| 2009/0115075 A1 | 5/2009 | Kessel et al. |
| 2013/0280886 A1 | 10/2013 | Kato et al. |
| 2014/0106473 A1* | 4/2014 | Andry ................ H01L 21/6835 438/4 |
| 2014/0151328 A1 | 6/2014 | Miyanari et al. |
| 2015/0325465 A1 | 11/2015 | Iwata et al. |
| 2017/0004991 A1* | 1/2017 | Yamamoto ................ C09J 7/00 |
| 2018/0233385 A1* | 8/2018 | Iwata .................... B32B 43/006 |

FOREIGN PATENT DOCUMENTS

| | | |
|---|---|---|
| JP | 2002-351070 A | 12/2002 |
| JP | 2003-177528 A | 6/2003 |
| JP | 2012224062 A * | 11/2012 |
| JP | 2013-243350 A | 12/2013 |
| JP | 2014-112618 A | 6/2014 |
| JP | 2014-129431 A | 7/2014 |
| JP | 2015-191940 A | 11/2015 |
| WO | 2015/072418 A1 | 5/2015 |

OTHER PUBLICATIONS

Nkansah, M. A. Preliminary photochemical studies of fluorene in various aqueous media. American Journal of Scientific and Industrial Research, 2014, vol. 5, pp. 97-103. (Year: 2014).*

Extended European Search Report dated Apr. 28, 2017, issued in counterpart European Patent Application No. 16199909.9. (6 pages).

Office Action dated Jul. 16, 2019, issued in JP Application No. 2016-221110, with English translation (10 pages).

* cited by examiner

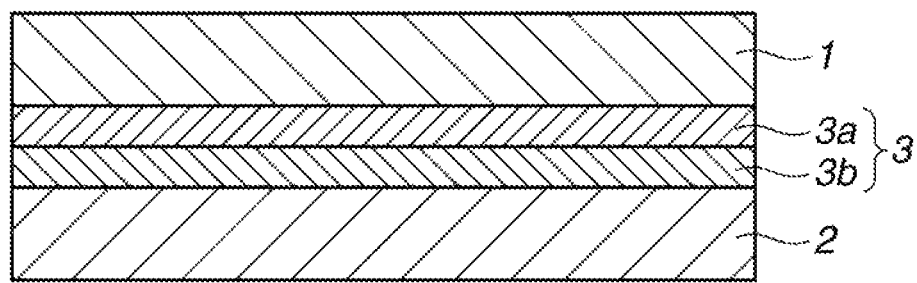

WAFER LAMINATE AND MAKING METHOD

CROSS-REFERENCE TO RELATED APPLICATION

This non-provisional application claims priority under 35 U.S.C. § 119(a) on Patent Application No. 2015-230407 filed in Japan on Nov. 26, 2015, the entire contents of which are hereby incorporated by reference.

TECHNICAL FIELD

This invention relates to a wafer laminate wherein a wafer is bonded to a transparent substrate through an adhesive layer or resin layer of specific structure, and a method for preparing the wafer laminate.

BACKGROUND ART

It is a common practice in the art that a wafer having a certain device function is bonded to glass through a resin layer to form a wafer/glass laminate. For example, one well-known structure is completed by applying a photosensitive resin material to a silicon wafer having an optical sensor function, processing the material by lithography to form a resin layer around the sensor, and bonding the wafer to glass through the resin layer.

The formation of the adhesive layer by the photolithography process starts with the step of coating a photosensitive adhesive composition or disposing a photosensitive adhesive film on a silicon substrate (or glass substrate) to form a photosensitive adhesive layer. Then the photosensitive adhesive layer is exposed, baked and developed. A protective glass substrate (or silicon substrate) is placed in close contact with the adhesive layer. Heat and pressure are applied to establish a bond between the adhesive layer and the protective glass. This is followed by heat curing and dicing, obtaining a cavity structure package. The known photosensitive resin compositions include a photosensitive resin composition comprising an acrylic resin, a photo-polymerizable compound and a photo-polymerization initiator (Patent Document 1), and a photosensitive resin composition comprising a photosensitive modified epoxy resin, a photo-polymerization initiator, a diluent solvent, and a thermosetting compound (Patent Document 2).

Since the resin layer for bonding must be processed by lithography prior to use, the aforementioned wafer/glass laminate has several problems that cumbersome steps are involved, and a high pressure is necessary for bonding of glass.

To solve these problems, Patent Document 3 proposes a thermosetting resin through which a wafer is directly bonded to glass. As compared with the system including a cavity structure by the photolithography method, the method of Patent Document 3 has advantages including simple steps and a wide margin of bonding process. The method, however, is restricted in that the bonding resin in contact with a wafer having a device function should not be absorptive at wavelength in an overall spectrum of light transmitted by glass, or if absorptive, the resin should not be degraded by the absorption.

CITATION LIST

Patent Document 1: JP-A 2002-351070
Patent Document 2: JP-A 2003-177528
Patent Document 3: WO 2015/072418

DISCLOSURE OF INVENTION

An object of the invention is to provide a wafer laminate including a wafer having a device function and a transparent substrate bonded thereto through an adhesive layer, which is adapted to shield light in the visible to near-infrared wavelength range on the substrate side and is effective for preventing the resin in contact with the wafer from degradation, and a method for preparing the wafer laminate.

The inventors have found that when a transparent substrate is bonded to a wafer through an adhesive layer to construct a substrate/wafer laminate, a bonding layer of two layers, a cured resin layer (A) of a specific structure having substantial absorption at wavelength up to 500 nm and a cured resin layer (B) which is a cured product of a thermosetting resin composition having a bonding function is affective as the adhesive layer, and in the step of bonding the substrate to the wafer, layers (A) and (B) are formed in the order of layers (A) and (B) from the substrate side.

According to the invention, there is obtained a laminate of a wafer having a device function and a transparent substrate, which is adapted to shield light in the visible to near-infrared wavelength range (specifically 300 to 800 nm) on the substrate side, is effective for preventing the resin in contact with the wafer from degradation and thus remains reliable.

In one aspect, the invention provides a wafer laminate comprising a transparent substrate, an adhesive layer formed on the substrate, and a wafer bonded to the adhesive layer, with a circuit-forming surface of the wafer facing the adhesive layer. The adhesive layer includes a first cured resin layer (A) disposed adjacent the substrate and having light-shielding properties and a second cured resin layer (B) disposed adjacent the wafer and comprising a cured product of a thermosetting resin composition.

In a preferred embodiment, the first cured resin layer (A) having light-shielding properties has a transmittance of up to 15% at wavelength 500 nm and substantial absorption at wavelength up to 500 nm. More preferably, the first cured resin layer (A) is a cured product of a resin composition comprising a polymer comprising repeating units having the general formula (1):

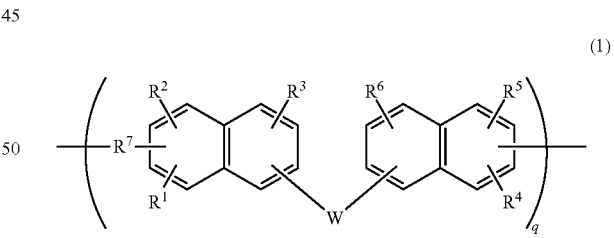

wherein $R^1$, $R^2$, $R^3$, $R^4$, $R^5$, and $R^6$ are each independently hydrogen, hydroxyl, or a $C_1$-$C_{20}$ monovalent organic group, at least one of $R^1$ to $R^3$ is hydroxyl, at least one of $R^4$ to $R^6$ is hydroxyl, $R^7$ is a single bond or a $C_1$-$C_{20}$ divalent organic group, W is a single bond or a $C_1$-$C_{30}$ divalent organic group, and q is such a natural number that the polymer has a weight average molecular weight of 500 to 500,000. The resin composition of the first cured resin layer (A) may further comprise at least one of a crosslinker, an acid generator and an organic solvent.

In a preferred embodiment, the second cured resin layer (B) is a cured product of a thermosetting resin composition based on a silicone resin polymer and/or epoxy resin polymer, the cured product having a resin modulus of 10 to 1,000 MPa at 25° C. More preferably, the thermosetting resin composition is based on a phenol-modified silicone resin and/or epoxy-modified silicone resin.

Even more preferably, the thermosetting resin composition based on a phenol-modified silicone resin is a composition comprising 100 parts by weight of a phenol-modified silicone resin comprising repeating units represented by the general formula (2) and having a weight average molecular weight of 3,000 to 500,000, and 0.1 to 50 parts by weight of at least one crosslinker which is selected from epoxy compounds having on average at least two epoxy groups per molecule,

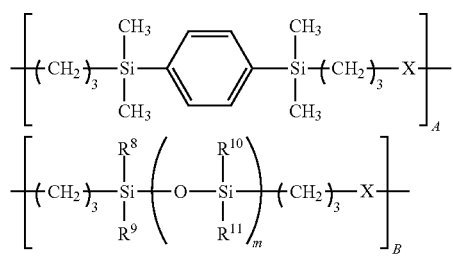
(2)

wherein $R^8$ to $R^{11}$ are each independently a $C_1$-$C_8$ monovalent hydrocarbon group, m is an integer of 1 to 100, B is a positive number, A is 0 or a positive number, A+B=1, and X is a divalent organic group having the general formula (3):

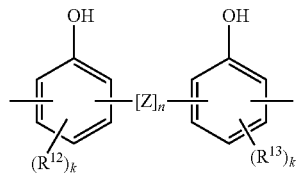
(3)

wherein Z is a divalent organic group selected from the following:

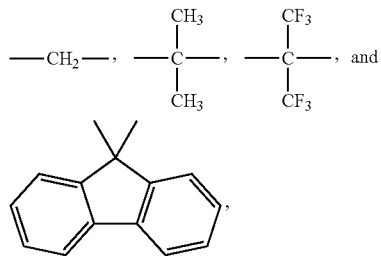

n is 0 or 1, $R^{12}$ and $R^{13}$ each are $C_1$-$C_4$ alkyl or alkoxy, and k is 0, 1 or 2.

Also preferably, the thermosetting resin composition based on an epoxy-modified silicone resin is a composition comprising 100 parts by weight of an epoxy-modified silicone resin comprising repeating units represented by the general formula (4) and having a weight average molecular weight of 3,000 to 500,000, and 0.1 to 50 parts by weight of at least one crosslinker which is selected from phenol compounds having on average at least two phenol groups per molecule and epoxy compounds having on average at least two epoxy groups per molecule,

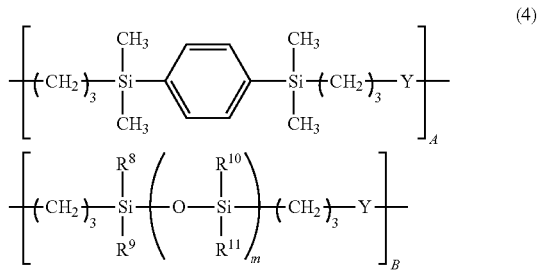
(4)

wherein $R^8$ to $R^{11}$ are each independently a $C_1$-$C_8$ monovalent hydrocarbon group, m is an integer of 1 to 100, B is a positive number, A is 0 or a positive number, A+B=1, and Y is a divalent organic group having the general formula (5):

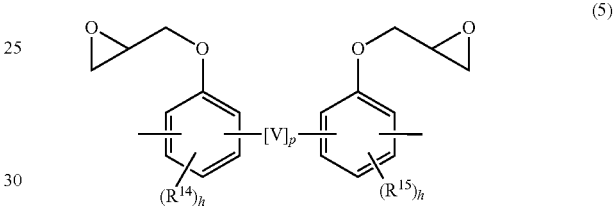
(5)

wherein V is a divalent organic group selected from the following:

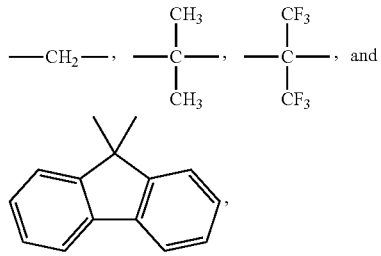

p is 0 or 1, $R^{14}$ and $R^{15}$ each are $C_1$-$C_4$ alkyl or alkoxy, and h is 0, 1 or 2.

In a preferred embodiment, the first cured resin layer (A) has a thickness of 0.1 to 30 μm, and the second cured resin layer (B) has a thickness of 1 to 200 μm.

In another aspect, the invention provides a method for preparing the wafer laminate defined above by bonding the wafer at its circuit-forming surface to the transparent substrate through the adhesive layer, the method comprising the steps of:

(a) forming the first cured resin layer (A) having light-shielding properties or a resin composition layer (A') for forming the first cured resin layer (A) directly on the transparent substrate, (b) forming a thermosetting resin composition layer (B') for forming the second cured resin layer (B) on the first cured resin layer (A) or resin composition layer (A'), (c) bonding the wafer at its circuit-forming surface to the thermosetting resin composition layer (B') under a reduced pressure, (d) heat curing the thermosetting resin composition layer (B') to form the second cured resin layer (B) and to bond it to the first cured resin layer (A), or when the resin composition layer (A') is used, simultaneously heat curing the resin composition layer (A') and the thermosetting resin composition layer (B') to form the first and second cured resin layers (A) and (B) and bond them together, and (e) grinding or polishing a non-circuit forming surface of the wafer bonded to the substrate.

Alternatively, the method for preparing the wafer laminate comprises the steps of:

(a) forming the first cured resin layer (A) having light-shielding properties or a resin composition layer (A') for forming the first cured resin layer (A) directly on the transparent substrate, (b') forming a thermosetting resin composition layer (B') for forming the second cured resin layer (B) on the circuit-forming surface of the wafer, (c') bonding the first cured resin layer (A) or resin composition layer (A') on the substrate and the thermosetting resin composition layer (B') on the wafer under a reduced pressure, (d) heat curing the thermosetting resin composition layer (B') to form the second cured resin layer (B) and to bond it to the first cured resin layer (A), or when the resin composition layer (A') is used, simultaneously heat curing the resin composition layer (A') and the thermosetting resin composition layer (B') to form the first and second cured resin layers (A) and (B) and bond them together, and (e) grinding or polishing a non-circuit-forming surface of the wafer bonded to the substrate.

Advantageous Effects of Invention

The laminate of the invention is established by bonding a transparent substrate to a wafer through a cured resin layer of specific two-layer structure. On use of the laminate, light of short wavelength of up to 500 nm does not reach the wafer surface. The laminate is highly reliable and allows for back side processing of the wafer. The laminate is thus advantageous in the fabrication of various device wafers.

BRIEF DESCRIPTION OF DRAWINGS

The only FIGURE, FIG. 1 is a cross-sectional view of a wafer laminate in one embodiment of the invention.

DESCRIPTION OF PREFERRED EMBODIMENTS

The notation (Cu—Cm) means a group containing from n to m carbon atoms per group.

Referring to FIG. 1, the wafer laminate of the invention is illustrated as comprising a transparent substrate 1 and a wafer 2 which are bonded through an adhesive layer 3 consisting of two layers, a first cured resin layer (A) 3a formed contiguous to the substrate 1 and a second cured resin layer (B) 3b formed contiguous to layer (A).

Substrate

The transparent substrate may be a glass or quartz substrate, typically having a thickness of 300 to 1,000 µm, especially 500 to 800 µm.

First Cured Resin Layer (A)

The first cured resin layer (A) is a cured resin layer (light-shielding layer) having substantial absorption at wavelength of up to 500 nm and typically having characteristics such as heat resistance, adhesion and chemical resistance. In a preferred embodiment, the first cured resin layer (A) is a cured product of a resin composition comprising a polymer comprising repeating units having the general formula (1) and a crosslinker for causing the polymer to be crosslinked via thermal reaction. As used herein, the term "substantial absorption at wavelength of up to 500 nm" means an absorptivity of at least 80% at wavelength of up to 500 nm.

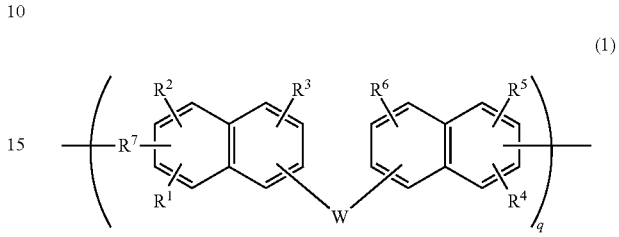

Herein $R^1$, $R^2$, $R^3$, $R^4$, $R^5$, and $R^6$ are each independently hydrogen, hydroxyl, or a $C_1$-$C_{20}$ monovalent organic group, at least one of $R^1$ to $R^3$ is hydroxyl, at least one of $R^4$ to $R^6$ is hydroxyl, $R^1$ is a single bond or a $C_1$-$C_{20}$ divalent organic group, W is a single bond or a $C_1$-$C_{30}$ divalent organic group, and q is such a natural number that the polymer has a weight average molecular weight of 500 to 500,000.

In formula (1), $R^1$, $R^2$, $R^3$, $R^4$, $R^5$, and $R^6$ which may be the same or different are each independently hydrogen, hydroxyl, or a monovalent organic group of 1 to 20 carbon atoms, especially 1 to 10 carbon atoms. Suitable monovalent organic groups include straight, branched or cyclic alkyl groups such as methyl, ethyl, n-propyl, isopropyl, n-butyl, sec-butyl, t-butyl, n-pentyl, neopentyl, n-hexyl, n-heptyl, n-octyl, n-nonyl, n-decyl, n-dodecyl, n-pentadecyl, n-icosyl, cyclopentyl, cyclohexyl, cyclopentylmethyl, cyclohexylmethyl, cyclopentylethyl, cyclohexylethyl, cyclopentylbutyl, cyclohexylbutyl and adamantyl, alkoxy groups such as methoxy, and epoxy groups such as glycidyloxy. Inter alia, hydrogen, hydroxyl and methyl are preferred.

In formula (1), $R^7$ is a single bond or a divalent organic group of 1 to 20 carbon atoms, especially 1 to 10 carbon atoms. Suitable organic groups include alkylene, phenylene, naphthylene, anthracenylene, norbornylene groups, and divalent derivatives of phthalic acid, which may have a substituent such as alkyl, aryl, halogen, nitro, nitrile, or hydroxyl.

In formula (1), W is a single bond or a divalent organic group of 1 to 30 carbon atoms, especially 1 to 10 carbon atoms. Suitable organic groups include alkylene, phenylene, naphthylene, anthracenylene, norbornylene groups, and divalent derivatives of phthalic acid, which may have a substituent such as alkyl, aryl, halogen, nitro, nitrile, or hydroxyl.

The polymer comprising repeating units of formula (1) may be prepared by reacting naphthalene or derivative thereof with an aldehyde compound. Examples of the naphthalene and derivatives thereof include 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynapthalene, 5-amino-1-naphthol, 2-methoxycarbonyl-1-naphthol, 1-(4-hydroxyphenyl)naphthalene, 6-(4-hydroxyphenyl)-2-naphthol, 6-cyclohexyl-2- naphthol, 1,1'-bi-2,2'-naphthol, 6,6'-bi-2,2'-naphthol, 9,9-bis(6-hydroxy-2-naphthyl)fluorene, 6-hydroxy-2-vinylnaphthalene, 1-hydroxymethylnaphthalene, and 2-hydroxymethylnaphthalene.

Typical of the aldehyde compound from which the repeating units of formula (1) are derived are aldehyde compounds having the general formula (6):

Q-CHO          (6)

wherein Q is hydrogen or an optionally substituted monovalent organic group of 1 to 30 carbon atoms, especially 1 to 10 carbon atoms.

Examples of the optionally substituted organic group Q include alkyl, phenyl, naphthyl, anthracenyl, norbornyl, and phthalyl groups, which may have a substituent such as alkyl, aryl, aldehyde, halogen, nitro, nitrile or hydroxyl.

Examples of the aldehyde compound having formula (6) include formaldehyde, trioxane, paraformaldehyde, acetaldehyde, propylaldehyde, adamantanecarboaldehyde, benzaldehyde, phenylacetaldehyde, α-phenylpropylaldehyde, β-phenylpropylaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthylaldehyde, 2-naphthylaldehyde, anthracenecarboxaldehyde, pyrenecarboxaldehyde, furfural. methylal, phthalaldehyde, isophthalaldehyde, terephthalaldehyde, naphthalenedicarboxaldehyde, anthracenedicarboxaldehyde, and pyrenedicarboxaldehyde.

Preferably naphthalene or derivative and the aldehyde compound are combined in such a ratio that 0.01 to 5 moles, more preferably 0.05 to 2 moles of the aldehyde compound is present per mole of naphthalene or derivative in total.

The polymer comprising repeating units of formula (1) may be prepared using the above-mentioned reactants, typically from polycondensation reaction of the reactants in a solventless system or in a solvent in the presence of an acid or base catalyst and at room temperature or under cooling or heating if desired.

Examples of the solvent used in the polycondensation reaction include alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane and trichloroethylene; hydrocarbons such as hexane, heptane, benzene, toluene, xylene and cumene; nitriles such as acetonitrile; ketones such as acetone, ethyl methyl ketone and isobutyl methyl ketone; esters such as ethyl acetate, n-butyl acetate, propylene glycol methyl ether acetate; lactones such as γ-butyrolactone; and aprotic polar solvents such as dimethyl sulfoxide, N,N-dimethylformamide, and hexamethylphosphoric triamide, which may be used alone or in admixture. The solvent may be used in an amount of 0 to 2,000 parts, preferably 10 to 2,000 parts by weight per 100 parts by weight of the reactants.

Examples of the acid catalyst used in the polycondensation reaction include mineral acids such as hydrochloric acid, hydrobromic acid, sulfuric acid, nitric acid, phosphoric acid, and heteropoly-acid; organic acids such as oxalic acid, trifluoroacetic acid, methanesulfonic acid, benzonesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltine dimethoxide, dibutyltin oxide, titanium tetrachloride, titanium tetrabromide, titanium(IV) methoxide, titanium(IV) ethoxide, titanium(IV) isopropoxide, and titanium(IV) oxide.

Examples of the base catalyst used in the polycondensation reaction include inorganic bases such as sodium hydroxide, potassium hydroxide, barium hydroxide, sodium carbonate, sodium hydrogencarbonate, potassium carbonate, lithium hydride, sodium hydride, potassium hydride, and calcium hydride; alkyl metals such as methyl lithium, n-butyl lithium, methylmagnesium chloride, and ethylmagnesium bromide; alkoxides such as sodium methoxide, sodium ethoxide, and potassium t-butoxide; and organic bases such as triethylamine, diisopropylethylamine, N,N-dimethylaniline, pyridine, and 4-dimethylaminopyridine.

The catalyst is preferably used in an amount of 0.001 to 100% by weight, more preferably 0.005 to 50% by weight based on the total weight of the reactants. The reaction temperature is preferably in a range from −50° C. to about the boiling point of the solvent, more preferably from room temperature to 100° C.

The polycondensation reaction may be carried out, for example, by adding entire amounts of naphthalene (or derivative), aldehyde and catalyst at a time, or by adding dropwise naphthalene (or derivative) and aldehyde in the presence of catalyst.

At the end of polycondensation reaction, any unreacted reactants and catalyst are desirably removed from the system. To this end, an appropriate method may be chosen depending on the properties of the reaction product, among a method of heating the reactor at a temperature of 130 to 230° C. to remove volatiles under a pressure of about 1 to 50 mmHg, a method of adding an appropriate solvent or water and fractionating the polymer, and a method of dissolving the polymer in a good solvent and re-precipitating in a poor solvent.

The polymer thus obtained should preferably have a weight average molecular weight (Mw) of 500 to 500,000, especially 1,000 to 100,000 as measured versus polystyrene standards by gel permeation chromatography (GPC). Likewise, the polymer should preferably have a dispersity (Mw/Mn) of 1.2 to 20. Once a monomer fraction, oligomer fraction and low-molecular-weight fraction having a Mw of less than 500 are cut off, the amount of volatiles during bake may be reduced, which is effective for preventing contamination around the bake cup and formation of surface defects resulting from volatiles dropping down.

In addition to the polymer, the resin composition may contain a crosslinker. The crosslinker is preferably selected from epoxy compounds and epoxy resins having at least two functional groups per molecule, and amino resins such as methylol melamine. Further preferably, a catalyst is added to promote crosslinking reaction of the polymer with the crosslinker.

Suitable epoxy compounds and epoxy resins include multifunctional epoxy resins having a functionality of 2, 3, 4 or more, for example, commercially available as EOCN-1020, EOCN-102S, XD-1000, NC-2000-L, EPPN-201, GAN, and NC6000 from Nippon Kayaku Co., Ltd. and crosslinkers of the following formulae.

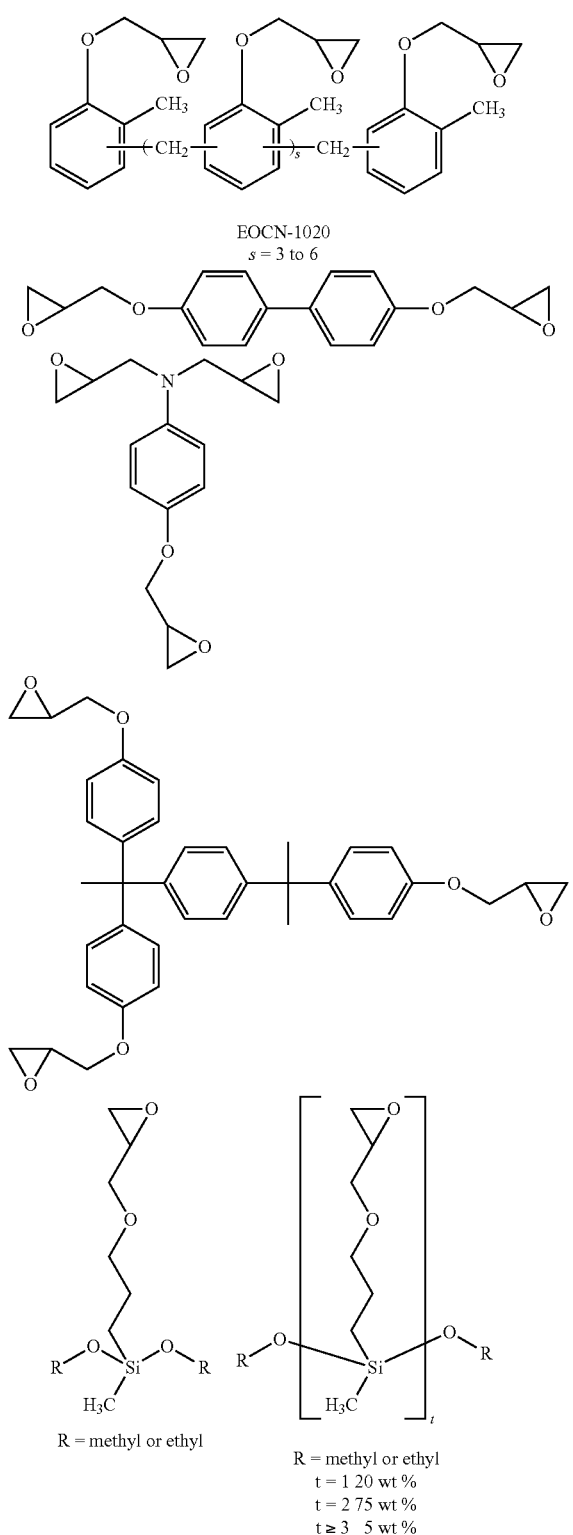

EOCN-1020
s = 3 to 6

R = methyl or ethyl

R = methyl or ethyl
t = 1  20 wt %
t = 2  75 wt %
t ≥ 3  5 wt %

The epoxy crosslinker may be added in an amount of 0.1 to 50 parts, preferably 0.1 to 30 parts, and more preferably 1 to 30 parts by weight per 100 parts by weight of the polymer comprising repeating units of formula (1). A mixture of two or more crosslinkers may be used. Less than 0.1 part of the crosslinker may fail to achieve a sufficient crosslinking density whereas more than 50 parts of the crosslinker corresponds to a relatively low proportion of the polymer, suggesting that the cured product may fail to exert satisfactory effects.

It is noted that when the above-mentioned epoxy resin is used as the crosslinker, a cure accelerator is preferably added as the catalyst. The epoxy resin cure accelerator is effective for adequate and uniform progress of curing reaction.

Examples of the epoxy resin cure accelerator include imidazole compounds such as 2-methylimidazole, 2-ethylimidazole, 2-ethyl-4-methylimidazole, ethylisocyanates of the foregoing, 2-phenylimidazole, 2-phenyl-4-methylimidazole, 2-phenyl-4-methyl-5-hydroxymethylimidazole, and 2-phenyl-4,5-dihydroxymethylimidazole; DBU compounds such as 1,8-diazabicyclo(5.4.0)undecene-7 (DBU), 1,5-diazabicyclo(4.3.0)nonene-5 (DBN), organic acid salts of DBU, phenolic resin salts of DBU, and tetraphenylborate salts of DBU derivatives; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine-triphenylborate, and tetraphenylphosphine-tetraphenylborate; quaternary phosphonium salts, tertiary amines such as triethyleneammonium-triphenylborate, and tetraphenylboric acid salts thereof.

The cure accelerators may be used alone or in admixture.

The amount of the cure accelerator used may be 0.1 to 10 parts, preferably 0.2 to 5 parts by weight per 100 parts by weight of the polymer comprising repeating units of formula (1).

Suitable amino resins such as methylol melamine include amino condensates modified with formaldehyde or formaldehyde-alcohol, and phenol compounds having on average at least two methylol or alkoxymethylol groups per molecule.

The amino resin should preferably have a Mw of 150 to 10,000, more preferably 200 to 3,000 as measured versus polystyrene standards by GPC. An amino resin with a Mw of less than 150 may fail to achieve sufficient cure whereas an amino resin with a Mw in excess of 10,000 may adversely affect the heat resistance of the cured composition.

Suitable amino condensates modified with formaldehyde or formaldehyde-alcohol include melamine condensates modified with formaldehyde or formaldehyde-alcohol and urea condensates modified with formaldehyde or formaldehyde-alcohol.

The melamine condensate modified with formaldehyde or formaldehyde-alcohol may be prepared, for example, by modifying a melamine monomer with formaldehyde into a methylol form in a well-known manner, or by further modifying it with an alcohol into an alkoxy form, i.e., into a modified melamine having the general formula (7). The alcohol used herein is preferably selected from lower alcohols, typically alcohols of 1 to 4 carbon atoms.

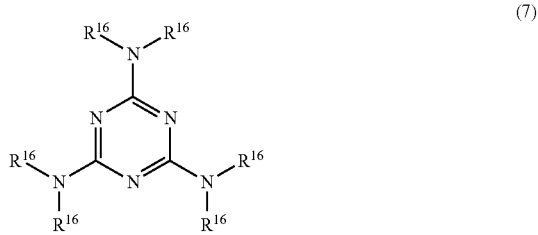

(7)

Herein $R^{16}$ which may be the same or different is a methylol group, an alkoxymethyl group containing a $C_1$-$C_4$ alkoxy moiety, or hydrogen, at least one $R^{16}$ being methylol or alkoxymethyl.

Examples of the modified melamine having formula (7) include trimethoxymethylmonomethylolmelamine, dimethoxymethylmonomethylolmelamine, trimethylolmelamine, hexamethylolmelamine, and hexamethoxymethylolmelamine. Subsequently, the modified melamine having formula (7) or an oligomer thereof (e.g., dimer, trimer or oligomer) is subjected to addition polycondensation with formaldehyde by an ordinary technique until the desired molecular weight is reached, obtaining a melamine condensate modified with formaldehyde or formaldehyde-alcohol. At least one modified melamine condensate selected from the monomers of formula (7) and condensates thereof may be used.

The urea condensate modified with formaldehyde or formaldehyde-alcohol may be prepared, for example, by modifying a urea condensate having a desired molecular weight with formaldehyde into a methylol form in a well-known manner, or further modifying it with an alcohol into an alkoxy form.

Examples of the modified urea condensate include methoxymethylated urea condensates, ethoxymethylated urea condensates, and propoxymethylated urea condensates. These modified urea condensates may be used alone or in admixture.

Examples of the phenol compound having on the average at least two methylol or alkoxymethylol groups per molecule include (2-hydroxy-5-methyl)-1,3-benzenedimethanol and 2,2',6,6'-tetramethoxymethylbisphenol A.

These amino condensates or phenol compounds may be used alone or in admixture.

Preferably the amino resin is used in an amount of 0.1 to 50 parts, more preferably 1 to 30 parts by weight per 100 parts by weight of the polymer comprising repeating units of formula (1). Less than 0.1 part of the amino resin may fail to achieve sufficient cure whereas more than 50 parts of the amino resin corresponds to a relatively low proportion of the polymer, suggesting that the cured product may fail to exert satisfactory effects.

Where the amino resin such as methylolmelamine is used as the crosslinker, a thermal acid generator is preferably added as the catalyst. The thermal acid generator is preferably an ammonium salt having the formula (8), but not limited thereto.

$$(S^-)(N^+(R^{17}R^{18}R^{19}R^{20})) \qquad (8)$$

Herein $R^{17}$, $R^{18}$, $R^{19}$ and $R^{20}$ are each independently hydrogen, a $C_1$-$C_{12}$ straight, branched or cyclic alkyl, alkenyl, oxoalkyl or oxoalkenyl group, $C_6$-$C_{20}$ aryl group, or $C_7$-$C_{12}$ aralkyl or aryloxoalkyl group, in which one or more or even all hydrogen atoms may be substituted by alkoxy moieties. $R^{17}$, $R^{18}$, $R^{19}$ and $R^{20}$ may bond with the nitrogen atom to form a ring, and in the case of ring formation, they represent a $C_3$-$C_{10}$ alkylene group or form a hetero-aromatic ring containing the nitrogen atom therein. $S^-$ is a sulfonic acid in which at least one α-position is fluorinated, or perfluoroalkylimidic acid or perfluoroalkylmethide acid.

Specifically, $S^-$ is selected from perfluoroalkanesulfonic acids such as triflate and nonaflate, sulfonates in which at least one α-position is fluorinated, imidic acids such as bis(trifluoromethylsulfonyl)imide, bis(perfluoroethylsulfonyl)imide, and bis(perfluorobutylsulfonyl)imide, and methide acids such as tris(trifluoromethylsulfonyl)methide and tris(perfluoroethylsulfonyl)methide.

Preferably the thermal acid generator is used in an amount of 0.1 to 15 parts, more preferably 0.1 to 10 parts by weight per 100 parts by weight of the polymer comprising repeating units of formula (1). Less than 0.1 part of the generator may fail to achieve sufficient cure whereas more than 15 parts may adversely affect shelf stability.

The composition formulated as above may be dissolved in a solvent, and the solution be applied to a glass substrate by suitable means such as a spin coater, roll coater, and die coater. Examples of the solvent used herein include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, propylene glycol mono-t-butyl ether acetate, and γ-butyrolactone, which may be used alone or in combinations of two or more.

If desired, the solution for forming the cured resin layer or a film thereof may contain a surfactant and an antioxidant for improving heat resistance or other properties.

Although the surfactant used herein is not particularly limited, examples include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenol ether and polyoxyethylene nonyl phenol ether; polyoxyethylene polyoxypropylene block copolymers; sorbitan fatty acid esters such as sorbitan monolaurate, sorbitan monopalmitate and sorbitan monostearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Mitsubishi Materials Electronic Chemicals Co., Ltd.), Megaface F171, F172, F173 (DIC Corp.), Fluorad FC430 and FC431 (3M-Sumitomo Co., Ltd.), Asahiguard AG710, Surflon S-381, S-382, SC101, SC102, SC103, SC104, SC105, SC106 (Asahi Glass Co., Ltd.), Surfynol E1004 (Nissin Chemical Industry Co., Ltd.), KH-10, KH-20, KH-30, and KH-40 (DKS Co., Ltd.); organosiloxane polymers KP341, X-70-092, X-70-093, X-70-1102 (Shin-Etsu Chemical Co., Ltd.), acrylic acid or methacrylic acid Polyflow No. 75, No. 95 (Kyoeisha Chemical Co., Ltd.). These surfactants may be used alone or in a combination of two or more.

The antioxidant used herein is preferably at least one compound selected from among hindered phenol compounds, hindered amine compounds, organophosphorus compounds, and organosulfur compounds.

Hindered Phenol Compounds

Although the hindered phenol compounds used herein are not particularly limited, the hindered phenol compounds listed below are preferred.

1,3,5-trimethyl-2,4,6-tris(3,5-di-t-butyl-4-hydroxybenzyl)-benzene (trade name: IRGANOX 1330), 2,6-di-t-butyl-4-methylphenol (trade name: Sumilizer BHT), 2,5-di-t-butylhydroquinone (trade name: Nocrac NS-7), 2,6-di-t-butyl-4-ethylphenol (trade name: Nocrac M-17), 2,5-di-t-pentylhydroquinone (trade name: Nocrac DAH),
2,2'-methylenebis(4-methyl-6-t-butylphenol) (trade name: Nocrac NS-6),
3,5-di-t-butyl-4-hydroxybenzyl phosphonate diethyl ester (trade name: IRGANOX 1222),
4,4'-thiobis(3-methyl-6-t-butylphenol) (trade name: Nocrac 300),
2,2'-methylenebis(4-ethyl-6-t-butylphenol) (trade name: Nocrac NS-5),
4,4'-butylidenebis(3-methyl-6-t-butylphenol) (Adeka Stab AO-40),
2-t-butyl-6-(3-t-butyl-2-hydroxy-5-methylbenzyl)-4-methyl-phenyl acrylate (trade name: Sumilizer GM),
2-[1-(2-hydroxy-3,5-di-t-pentylphenyflethyl]-4,6-di-t-pentylphenyl acrylate (trade name: Sumilizer GS),
2,2'-methylenebis[4-methyl-6-(α-methylcyclohexyl)phenol],
4,4'-methylenebis(2,6-di-t-butylphenol) (trade name: Seenox 226M),
4,6-bis(octylthiomethyl)-o-cresol (trade name: IRGANOX 1520L),
2,2'-ethylenebis(4,6-di-t-butylphenol),
octadecyl 3-(3,5-di-t-butyl-4-hydroxyphenyl)propionate (trade name: IRGANOX 1076),
1,1,3-tris(2-methyl-4-hydroxy-5-t-butylphenyl)butane (trade name: Adeka Stab AO-30),
tetrakis[methylene-(3,5-di-t-butyl-4-hydroxyhydrocinnamate)]-methane (trade name: Adeka Stab AO-60),
triethylene glycol bis[3-(3-t-butyl-5-methyl-4-hydroxy-phenylpropionate] (trade name: IRGANOX 245),
2,4-bis(n-octylthio)-6-(4-hydroxy-3,5-di-t-butylanilino)-1,3,5-triazine (trade name: IRGANOX 565),
N,N'-hexamethylenebis(3,5-di-t-butyl-4-hydroxyhydrocinnamide) (trade name: IRGANOX 1098),
1,6-hexanediol-bis[3-(3,5-di-t-butyl-4-hydroxyphenyl)-propionate] (trade name: IRGANOX 259),
2,2-thio-diethylenebis[3-(3,5-di-t-butyl-4-hydroxyphenyl)-propionate] (trade name: IRGANOX 1035),
3,9-bis[2-[3-(3-t-butyl-4-hydroxy-5-methylphenyl)propionyl-oxy]-1,1-dimethylethyl] 2,4,8,10-tetraoxaspiro[5.5] undecane (trade name: Sumilizer GA-80),
tris(3,5-di-t-butyl-4-hydroxybenzyl) isocyanurate (trade name: IRGANOX 3114),
bis(ethyl 3,5-di-t-butyl-4-hydroxybenzylphosphonate) calcium/polyethylene wax 50/50 mixture (trade name: IRGANOX 1425WL),
isooctyl 3-(3,5-di-t-butyl-4-hydroxyphenyl)propionate (trade name: IRGANOX 1135),
4,4'-thiobis(6-t-butyl-3-methylphenol) (trade name: Sumilizer WX-R),
6-[3-(3-t-butyl-4-hydroxy-5-methylphenyl)propoxy]-2,4,8,10-tetra-t-butyldibenzo[d,f][1,3,2]dioxaphosphepin (trade name: Sumilizer GP), etc.

Hindered Amine Compounds

Although the hindered amine compounds used herein are not particularly limited, the hindered amine compounds listed below are preferred.
p,p'-dioctyldiphenylamine (trade name: IRGANOX 5057),
phenyl-α-naphthylamine (Nocrac PA),
poly(2,2,4-trimethyl-1,2-dihydroquinoline) (trade name: Nocrac 224, 224-S),
6-ethoxy-2,2,4-trimethyl-1,2-dihydroquinoline (trade name: Nocrac AW),
N,N'-diphenyl-p-phenylenediamine (trade name: Nocrac DP),
N,N'-di-β-naphthyl-p-phenylenediamine (trade name: Nocrac White),
N-phenyl-N'-isopropyl-p-phenylenediamine (trade name: Nocrac 810NA),
N,N'-diallyl-p-phenylenediamine (trade name: Nonflex TP),
4,4'-(α,α-dimethylbenzyl)diphenylamine (trade name: Nocrac CD),
p,p-toluenesulfonylaminodiphenylamine (trade name: Nocrac TD),
N-phenyl-N'-(3-methacryloxy-2-hydroxypropyl)-p-phenylene-diamine (trade name: Nocrac G1).
N-(1-methylheptyl)-N'-phenyl-p-phenylenediamine (trade name: Ozonon 35),
N,N'-di-sec-butyl-p-phenylenediamine (trade name: Sumilizer BPA),
N-phenyl-N'-1,3-dimethylbutyl-p-phenylenediamine (trade name: Antigene 6C),
alkylated diphenylamine (trade name: Sumilizer 9A),
dimethyl-1-(2-hydroxyethyl)-4-hydroxy-2,2,6,6-tetramethyl-piperidine succinate polycondensate (trade name: Tinuvin 622LD),
poly[[6-(1,1,3,3-tetramethylbutyl)amino]-1,3,5-triazine-2,4-diyl][(2,2,6,6-tetramethyl-4-piperidyl)imino]hexamethylene-[(2,2,6,6-tetramethyl-4-piperidyl)imino]] (trade name: CHIMASSORB 944),
N,N'-bis(3-aminopropyl)ethylenediamine-2,4-bis[N-butyl-N-(1,2,2,6,6-pentamethyl-4-piperidyl)amino]-6-chloro-1,3,5-triazine condensate (trade name: CHIMASSORB 119FL),
bis(1-octyloxy-2,2,6,6-tetramethyl-4-piperidyl)sebacate (trade name: Tinuvin 123),
bis(2,2,6,6-tetramethyl-4-piperidyl)sebacate (trade name: Tinuvin 770),
bis(1,2,2,6,6-pentamethyl-4-piperidyl) 2-(3,5-di-t-butyl-4-hydroxybenzyl)-2-n-butylmalonate (trade name: Tinuvin 144),
bis(1,2,2,6,6-pentamethyl-4-piperidyl)sebacate (trade name: Tinuvin 765),
tetrakis(1,2,2,6,6-pentamethyl-4-piperidyl) 1,2,3,4-butane-tetracarboxylate (trade name: LA-57),
tetrakis(2,2,6,6-tetramethyl-4-piperidyl) 1,2,3,4-butane-tetracarboxylate (trade name: LA-52),
an esterified mixture of 1,2,3,4-butanetetracarboxylic acid with 1,2,2,6,6-pentamethyl-4-piperidinol and 1-tridecanol (trade name: LA-62),
an esterified mixture of 1,2,3,4-butanetetracarboxylic acid with 2,2,6,6-tetramethyl-4-piperidinol and 1-tridecanol (trade name: LA-67),
an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P),
an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (trade name: LA-68LD),
(2,2,6,6-tetramethylene-4-piperidyl)-2-propylene carboxylate (trade name: Adeka Stab LA-82),
(1,2,2,6,6-pentamethyl-4-piperidyl)-2-propylene carboxylate (trade name: Adeka Stab LA-87), etc.

Organophosphorus Compounds

Although the organophosphorus compounds used herein are not particularly limited, the organophosphorus compounds listed below are preferred.
bis(2,4-di-t-butylphenyl)[1,1-biphenyl]-4,4'-diyl bisphosphite, 9,10-dihydro-9-oxa-10-phosphaphenanthrene-10-oxide (trade name: Sanko HCA),
triethyl phosphite (trade name: JP302),
tri-n-butyl phosphite (trade name: 304), triphenyl phosphite (trade name: Adeka Stab TPP),
diphenyl monooctyl phosphite (trade name: Adeka Stab C),
tri(p-cresyl) phosphite (trade name: Chelex-PC),
diphenyl monodecyl phosphite (trade name: Adeka Stab 135A),
diphenyl mono(tridecyl) phosphite (trade name: JPM313),
tris(2-ethylhexyl) phosphite (trade name: JP308),
phenyl didecyl phosphite (trade name: Adeka Stab 517),
tridecyl phosphite (trade name: Adeka Stab 3010),
tetraphenyl dipropylene glycol diphosphite (trade name: JPP100),
bis(2,4-di-L-butylphenyl) pentaerythritol diphosphite (trade name: Adeka Stab PEP-24G),
tris(tridecyl) phosphite (trade name: JP333E),
bis(nonylphenyl) pentaerythritol diphosphite (trade name: Adeka Stab PEP-4C),
bis(2,6-di-t-butyl-4-methylphenyl) pentaerythritol diphosphite (trade name: Adeka Stab PEP-36),
bis[2,4-di(1-phenylisopropyl)phenyl] pentaerythritol diphosphite (trade name: Adeka Stab PEP-45),
trilauryl trithiophosphite (trade name: JPS312),
tris(2,4-di-t-butylphenyl) phosphite (trade name: IRGAFOS 168),
tris(nonylphenyl) phosphite (trade name: Adeka Stab 1178),
distearyl pentaerythritol diphosphite (trade name: Adeka Stab PEP-8),
tris(mono, dinonylphenyl) phosphite (trade name: Adeka Stab 329K),
trioleyl phosphite (trade name: Chelex-OL),
tristearyl phosphite (trade name: JP318E),
4,4'-butylidene bis(3-methyl-6-t-butylphenylditridecyl) phosphite (trade name: JPH1200),
tetra(mixed $C_{12}$-$C_{15}$ alkyl)-4,4'-isopropylidene diphenyl diphosphite (trade name: Adeka Stab 1500),
tetra(tridecyl)-4,4'-butylidene bis(3-methyl-6-t-butylphenyl) diphosphite (trade name: Adeka Stab 260),
hexa(tridecyl)-1,1,3-tris(2-methyl-5-t-butyl-4-hydroxy-phenyl)butane triphosphite (trade name: Adeka Stab 522A),
hydrogenated bisphenol A phosphite polymer (HBP),
tetrakis(2,4-di-t-butylphenyloxy)-4,4'-biphenylene diphosphine (trade name: P-EPQ),
tetrakis(2,4-di-t-butyl-5-methylphenyloxy) 4,4'-biphenylene diphosphine (trade name: GSY-101P),
2-[[2,4,8,10-tetrakis(1,1-dimethylethyl)dibenzo[d,f][1,3,2]-dioxaphosphepin-6-yl]oxy]-N,N-bis[2-[[2,4,8,10-tetrakis (1,1-dimethylethyl)dibenzo[d,f][1,3,2]dioxaphosphepin-6-yl]oxy]-ethyl]ethanamine (trade name: IRGAFOS 12),
2,2'-methylenebis(4,6-di-t-butylphenyfloctyl phosphite (trade name: Adeka Stab HP-10), etc.

Organosulfur Compounds

Although the organosulfur compounds used herein are not particularly limited, the organosulfur compounds listed below are preferred.
dilauryl 3,3'-thiodipropionate (trade name: Sumilizer TPL-R),
dimyristyl 3,3'-thiodipropionate (trade name: Sumilizer TPM),
distearyl 3,3'-thiodipropionate (trade name: Sumilizer TPS),
pentaerythritol tetrakis(3-laurylthiopropionate) (trade name: Sumilizer TP-D),
ditridecyl 3,3'-thiodipropionate (trade name: Sumilizer TL),
2-mercaptobenzimidazole (trade name: Sumilizer MB),
ditridecyl 3,3'-thiodipropionate (trade name: Adeka Stab AO-503A),
1,3,5-tris-β-stearylthiopropionyloxyethyl isocyanurate,
didodecyl 3,3'-thiodipropionate (trade name: IRGANOX PS 800FL),
dioctadecyl 3,3'-thiodipropionate (trade name: IRGANOX PS 802FL), etc.

Of the foregoing antioxidants, Adeka Stab AO-60 is most preferred. An appropriate amount of the antioxidant added is 0.5 to 5 parts by weight, preferably 1 to 3 parts by weight per 100 parts by weight of the polymer comprising repeating units of formula (1). Outside the range, less amounts may fail to exert a heat resistant effect whereas larger amounts may become less compatible. Notably the antioxidant is not limited to one type and a mixture of two or more types may be used.

To the resin composition, any well-known filler such as silica may be added in an amount of up to 50 parts by weight per 100 parts by weight of the polymer comprising repeating units of formula (1) for further enhancing heat resistance.

The resin composition thus formulated may take the form of a solution which is obtained by dissolving the components in a solvent. The resin composition solution may be used as such, i.e., applied onto a transparent substrate by any suitable techniques such as spin coating, printing and dipping, after which the coating may be heated on a hot plate or oven to volatilize off the solvent.

In an alternative embodiment, the resin composition may take the form of a film which is obtained by removing the solvent from the resin composition solution. The resin composition in film form may be applied onto a transparent substrate by a laminating technique.

Once a layer of the resin composition is formed on a transparent substrate by either of the above procedures, it is heat cured into cured resin layer (A). This cure may be achieved by effecting curing reaction on a hot plate or oven, typically at a temperature of 100 to 350° C., preferably 150 to 300° C. The curing reaction may also be achieved, after a laminate is constructed, by heating the overall laminate.

The cured resin layer (A) formed on the transparent substrate is desirably capable of shielding more than 85% of light in a wavelength range of up to 500 nm. The cured resin layer (A) preferably has a thickness of 0.1 to 30 µm, more preferably 0.3 to 20 µm. A layer of less than 0.1 µm may be insufficient to shield light whereas a layer of more than 30 µm may become less flat.

As mentioned just above, the cured resin layer (A) functions as a light-shielding layer, specifically has a transmittance of up to 15%, preferably up to 14%, and more preferably up to 12% at wavelength 500 nm and is substantially absorptive at wavelength up to 500 nm, that is, shields more than 85% of light of wavelength up to 500 nm.

Second Cured Resin Layer (B)

The second cured resin layer (B) is generally selected from epoxy resins, polyimide resins, silicone resins, and phenolic resins, as viewed from heat resistance, and should be fully transparent to light of wavelength in excess of 500 nm. For the purpose of bonding heterogeneous substrates, i.e., a transparent substrate (e.g., glass substrate) and a silicon wafer, and from the standpoint of warpage suppression, the cured resin of second cured resin layer (B) should preferably have a modulus of 10 MPa to 1,000 MPa (=1 GPa) at 25° C. From these aspects, the second cured resin layer (B) is preferably formed using a thermosetting resin composition based on a silicone resin polymer and/or epoxy resin polymer, especially phenol-modified silicone resin and/or epoxy-modified silicone resin.

Preferred as the phenol-modified silicone resin is a resin having a structure represented by the general formula (2).

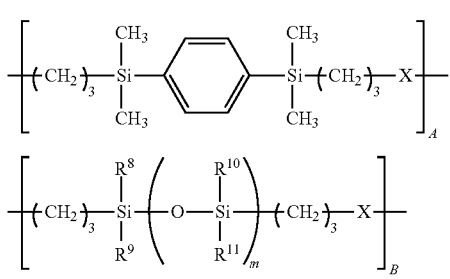
(2)

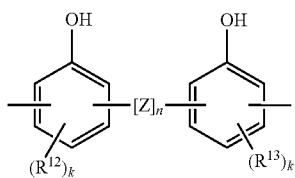

Herein $R^8$ to $R^{11}$ are each independently a $C_1$-$C_8$ monovalent hydrocarbon group, m is an integer of 1 to 100, B is a positive number, A is 0 or a positive number, A+B=1, and X is a divalent organic group having the general formula (3):

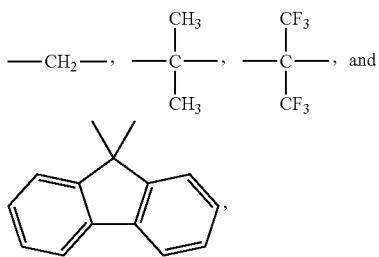
(3)

wherein Z is a divalent organic group selected from the following:

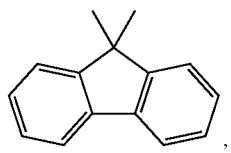

n is 0 or 1, $R^{12}$ and $R^{13}$ each are $C_1$-$C_4$ alkyl or alkoxy, and k is 0, 1 or 2.

Preferred as the epoxy-modified silicone resin is a resin having a structure, represented by the general formula (4).

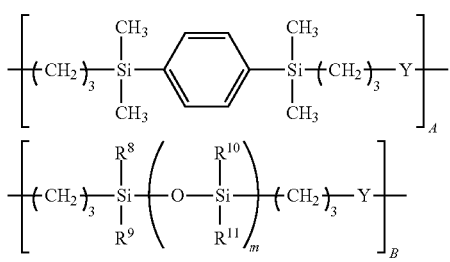
(4)

Herein $R^8$ to $R^{11}$ are each independently a $C_1$-$C_8$ monovalent hydrocarbon group, m is an integer of 1 to 100, B is a positive number, A is 0 or a positive number, A+B=1, and Y is a divalent organic group having the general formula (5):

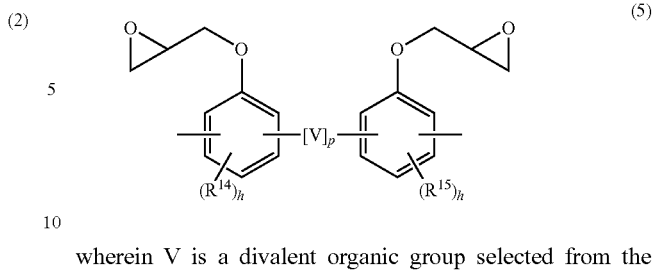
(5)

wherein V is a divalent organic group selected from the following:

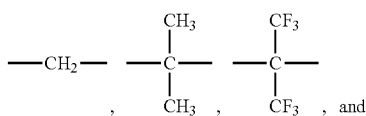

p is 0 or 1, $R^{14}$ and $R^{15}$ each are $C_1$-$C_4$ alkyl or alkoxy, and h is 0, 1 or 2.

The phenol or epoxy-modified silicone resin of formula (2) or (4) should preferably have a Mw of 3,000 to 500,000, more preferably 10,000 to 100,000 as measured versus polystyrene standards by GPC.

The thermosetting resin composition based on the phenol or epoxy-modified silicone resin of formula (2) or (4) contains a crosslinker so that the composition may be heat cured. For the phenol-modified silicone resin of formula (2), the crosslinker is at least one member selected from amino condensates, melamine resins, and urea resins modified with formaldehyde or formaldehyde-alcohol, and epoxy compounds having on average at least two epoxy groups per molecule. For the epoxy-modified silicone resin of formula (4), the crosslinker is at least one member selected from epoxy compounds having on average at least two epoxy groups per molecule and phenol compounds having on average at least two phenol groups per molecule.

The multifunctional epoxy compounds, amino condensates, melamine resins, urea resins, and phenol compounds used with the silicone resin of formula (2) or (4) are not particularly limited, and suitable examples thereof are as exemplified above for the first cured resin layer (A).

The crosslinker may be used in an amount of 0.1 to 50 parts, preferably 0.1 to 30 parts, and more preferably 1 to 20 parts by weight per 100 parts by weight of the phenol or epoxy-modified silicone resin.

The thermosetting resin composition may further contain a curing catalyst such as an acid anhydride in an amount of up to 10 parts by weight per 100 parts by weight of the phenol or epoxy-modified silicone resin.

The thermosetting resin composition is dissolved in a solvent to form a solution, which is coated on the first cured resin layer (A) or a wafer by suitable means such as a spin coater, roll coater or die coater. Examples of the solvent used herein include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, propylene glycol mono-t-butyl ether acetate, and γ-butyrolactone, which may be used alone or in combinations of two or more.

To the thermosetting resin composition, an antioxidant and a surfactant may be added for improving heat resistance and coating uniformity. Examples of these additives are as exemplified above for the first cured resin layer (A). Similarly, a filler such as silica for improving heat resistance may be added in an amount of up to 50 parts by weight per 100 parts by weight of the resin.

The thermosetting resin composition formulated as above is heat cured to form the second cured resin layer (B), which preferably has a thickness of 1 to 200 μm, more preferably 5 to 150 μm, depending on steps on the wafer. A layer with a thickness of less than 1 μm may fail to provide sufficient adhesion for bonding whereas a layer with a thickness in excess of 200 μm may adversely affect the flatness of coated wafer.

Preparation of Wafer Laminate

The method for preparing the wafer laminate according to the invention uses a transparent substrate, a wafer having a circuit-forming surface, and an adhesive layer consisting of two layers: first cured resin layer (A) and second cured resin layer (B). The method involves the steps (a) to (e), which are described below.

Step (a):

Step (a) is to form the first cured resin layer (A) having light-shielding properties directly on the transparent substrate. A solution of a resin composition capable of forming layer (A) is applied onto the substrate by suitable means such as a spin coater or roll coater. The coating may be prebaked at a temperature of 80 to 200° C., preferably 100 to 180° C., depending on the volatility of the solvent, prior to use. Alternatively, a film of the resin composition may be laminated onto the substrate.

Once a resin composition layer (A') is formed on the substrate by the above procedure, it is heat cured into cured resin layer (A). This cure may be achieved by effecting curing reaction on a hot plate or oven, typically at a temperature of 100 to 350° C., preferably 150 to 300° C. The curing reaction may also be achieved, after a green wafer laminate is constructed using resin composition layer (A') in to the uncured state, by heating the overall laminate.

Step (b) or (b'):

Step (b) is to form a thermosetting resin composition layer (B') for forming the second cured resin layer (B) on the first cured resin layer (A) or resin composition layer (A') on the substrate. Step (b') is to form the thermosetting resin composition layer (B') on the circuit-forming surface of the wafer.

Like layer (A) or (A'), the thermosetting resin composition layer (B') may be formed on first layer (A) or (A') on the substrate or on the wafer, by spin coating a solution and prebaking or by laminating a film.

The wafer has a pair of opposed surfaces, that is, a front surface where a semiconductor circuit is formed (circuit-forming surface) and a back surface where a semiconductor circuit is not formed (non-circuit-forming surface). The wafer which can be used herein is typically a semiconductor wafer. Suitable semiconductor wafers include silicon wafers, germanium wafers, gallium-arsenic wafers, gallium-phosphorus wafers, and gallium-arsenic-aluminum wafers. Although the thickness of the wafer is not particularly limited, it is typically 600 to 800 μm, more typically 625 to 775 μm.

Step (c) or (c'):

Step (c) is to bond the wafer at its circuit-forming surface to the thermosetting resin composition layer (B') under a reduced pressure. Step (c') is to bond the first cured resin layer (A) or resin composition layer (A') on the substrate and the thermosetting resin composition layer (B') on the wafer under a reduced pressure.

The substrate and the wafer having layer (A) or (A') and layer (B') formed thereon are joined together via the layers into a wafer laminate (also referred to as bonded substrate). The assembly is uniformly compressed preferably at a temperature of 40 to 200° C., more preferably 60 to 180° C. in vacuum or reduced pressure, yielding a wafer laminate of wafer bonded to substrate. The wafer bonding system used herein includes commercially available wafer bonders such as EVG520IS and 850 TB from EV Group, and XBC300 from SUSS MicroTec AG.

Step (d):

Step (d) is to heat cure layer (B') or layers (A') and (B') of the substrate/wafer laminate resulting from step (c) to bond cured resin layers (A) and (B) together. Once the substrate/wafer laminate is constructed, it is heated at 120 to 220° C., preferably 150 to 200° C. for 10 minutes to 4 hours, preferably 30 minutes to 2 hours, whereby resin layer (B) is cured.

Step (e):

Step (e) is to grind or polish the non-circuit-forming surface of the wafer bonded to the substrate. Step (e) is intended to reduce the thickness of the wafer by grinding or polishing the wafer back surface of the wafer laminate resulting from step (d). The technique of grinding the wafer back surface is not particularly limited, and any well-known grinding techniques may be used. For example, the wafer may be ground by a grinding wheel (e.g., diamond grinding wheel), while feeding water to the wafer and the wheel for cooling. As the means for grinding the wafer back surface, for example, a surface grinder DAG-810 by DISCO Co., Ltd. may be used. The wafer back surface may also be subjected to chemical mechanical polishing (CMP).

It has been described that a wafer laminate is completed by combining the transparent substrate (e.g., glass or quartz substrate), the adhesive layer, and the substrate having a circuit-forming surface.

EXAMPLE

Examples of the invention are given below by way of illustration and not by way of limitation. All parts are by weight. Weight and number average molecular weights (Mw and Mn) are measured by gel permeation chromatography (GPC) versus polystyrene standards, and a dispersity (Mw/Mn) is computed therefrom.

Resin Synthesis Example 1

A flask equipped with a stirrer, thermometer, nitrogen purge line and reflux condenser was charged with 43.1 g of 9,9'-bis(3-allyl-4-hydroxyphenyl)fluorene (M-1), 29.5 g of organohydrogensiloxane having the average structural formula (M-3), 135 g of toluene, and 0.04 g of chloroplatinic acid and heated at 80° C. Then, 17.5 g of 1,4-bis(dimethylsilyl)benzene (M-5) was added dropwise to the flask over one hour while the flask internal temperature rose to 85° C. At the end of dropwise addition, the reaction solution was aged at 80° C. for 2 hours. Toluene was distilled off, and instead, 80 g of cyclohexanone was added, obtaining a resin solution in cyclohexanone having a resin solid concentration of 50 wt %. The molecular weight of the resin in the solution was determined by GPC, finding a Mw of 45,000. To 50 g of the resin solution were added 7.5 g of an epoxy compound (EOCN-1020 by Nippon Kayaku Co., Ltd.) as crosslinker, 0.2 g of bis(t-butylsulfonyl)diazomethane (BSDM by Wako Pure Chemical Industries, Ltd.) as curing catalyst, and 0.1 g of tetrakis[methylene-(3,5-di-t-butyl-4-hydroxyhydrocinnamate)]-methane (Adeka STAB AO-60) as antioxidant. Filtration through a membrane filter with a pore size of 1 µm yielded a thermosetting resin composition solution (B-1).

Resin Synthesis Example 2

In a 5-L flask equipped with a stirrer, thermometer, nitrogen purge line and reflux condenser, 84.1 g of epoxy compound (M-2) was dissolved in 600 g of toluene. Then 294.6 g of compound (M-3) and 25.5 g of compound (M-4) were added to the flask, which was heated at 60° C. Then 1 g of platinum-on-carbon catalyst (5 wt %) was added. It was seen that the internal temperature rose to 65-67° C. Thereafter, the flask was further heated at 90° C., held at the temperature for 3 hours for ripening, and cooled to room temperature. To the reaction solution was added 600 g of methyl isobutyl ketone (MIBK). The reaction solution was passed through a filter under pressure to remove the platinum catalyst. Once the solvent was distilled off in vacuum from the resin solution, 270 g of propylene glycol monomethyl ether acetate (PGMEA) was added to the residue to form a resin solution in PGMEA having a resin solid concentration of 60 wt %. The molecular weight of the resin in the solution was determined by GPC, finding a Mw of 28,000. To 100 g of the resin solution were added 9 g of tetrafunctional phenol compound (TEP-TPA by Asahi Organic Chemical Industry Co., Ltd.) and 0.2 g of tetrahydrophthalic anhydride (Rikacid HH-A by New Japan Chemical Co., Ltd.). Filtration through a membrane filter with a pore size of 1 µm yielded a thermosetting resin composition solution (B-2).

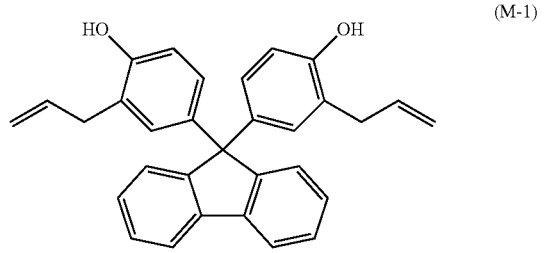

(M-1)

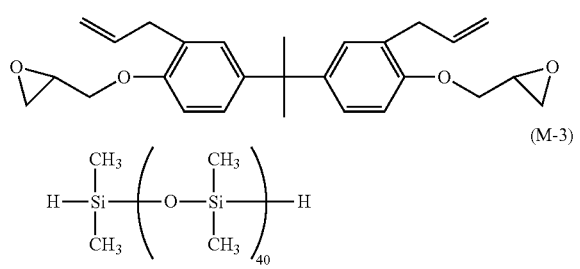

(M-2)

(M-3)

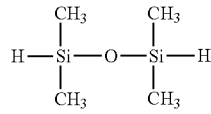

(M-4)

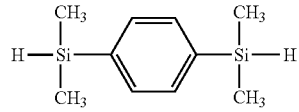

(M-5)

Resin Synthesis Example 3

A 1000-mL flask was charged with 80 g (0.50 mol) of 1,5-dihydroxynaphthalene as compound (M-6), 51.6 g (0.30 mol) of 2-hydroxy-6-naphthaldehyde as compound (M-7), and 145 g of methyl cellosolve. With stirring at 70° C., 20 g of a methyl cellosolve solution of 20 wt % p-toluenesulfonic acid was added. The solution was heated at 85° C., stirred at the temperature for 6 hours, cooled to room temperature, and diluted with 800 mL of ethyl acetate. The solution was transferred to a separatory funnel, and repeatedly washed with 200 mL of deionized water to remove the reaction catalyst and metal impurities. The solution was concentrated under reduced pressure, and 600 mL of ethyl acetate was added to the concentrate, which was poured into 2,400 mL of hexane for precipitation of the polymer. The polymer precipitate was filtered, collected, and dried in vacuum, obtaining Polymer 1 consisting of repeating units of the following structural formula. Polymer 1 was determined for Mw and Mw/Mn by GPC and for compositional ratio by $^1$H-NMR analysis.

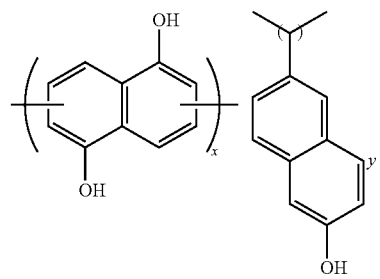

$x/(x + y) = 0.59$
$Mw = 3,200$
$Mw/Mn = 2.44$

Resin Synthesis Example 4

A 1000-mL flask was charged with 80 g (0.50 mol) of 1,5-dihydroxynaphthalene as compound (M-6), 9.0 g (0.30 mol) of paraformaldehyde as compound (M-8), and 145 g of methyl cellosolve. With stirring at 70° C., 20 g of a methyl cellosolve solution of 20 wt % p-toluenesulfonic acid was added. The solution was heated at 85° C., stirred at the temperature for 6 hours, cooled to room temperature, and diluted with 800 mL of ethyl acetate. The solution was transferred to a separatory funnel, and repeatedly washed with 200 mL of deionized water to remove the reaction catalyst and metal impurities. The solution was concentrated under reduced pressure, and 600 mL of ethyl acetate was added to the concentrate, which was poured into 2,400 mL of hexane for precipitation of the polymer. The polymer precipitate was filtered, collected, and dried in vacuum, obtaining Polymer 2 consisting of repeating units of the following structural formula. Polymer 2 was determined for Mw and Mw/Mn by GPC and for compositional ratio by $^1$H-NMR analysis.

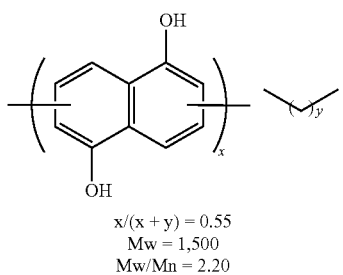

x/(x + y) = 0.55
Mw = 1,500
Mw/Mn = 2.20

Resin Synthesis Example 5

A 1000-mL flask was charged with 72 g (0.50 mol) of 1-hydroxynaphthalene as compound (M-9), 51.6 g (0.30 mol) of 2-hydroxy-6-naphthaldehyde as compound (M-7), and 145 g of methyl cellosolve. With stirring at 70° C., 20 g of a methyl cellosolve solution of 20 wt % p-toluenesulfonic acid was added. The solution was heated at 85° C., stirred at the temperature for 6 hours, cooled to room temperature, and diluted with 800 mL of ethyl acetate. The solution was transferred to a separatory funnel, and repeatedly washed with 200 mL of deionized water to remove the reaction catalyst and metal impurities. The solution was concentrated under reduced pressure, and 600 mL of ethyl acetate was added to the concentrate, which was poured into 2,400 mL of hexane for precipitation of the polymer. The polymer precipitate was filtered, collected, and dried in vacuum, obtaining Polymer 3 consisting of repeating units of the following structural formula. Polymer 3 was determined for Mw and Mw/Mn by GPC and for compositional ratio by $^1$H-NMR analysis.

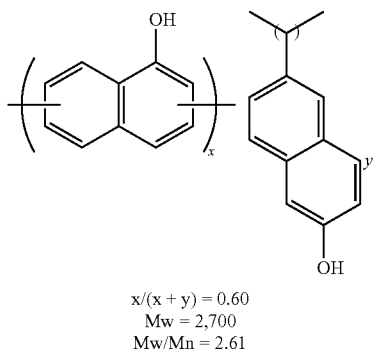

x/(x + y) = 0.60
Mw = 2,700
Mw/Mn = 2.61

Comparative Resin Synthesis Example 1

A 1000-mL flask was charged with 32.4 g (0.30 mol) of 2-methylhydroxybenzene as compound (M-10), 51.6 g (0.30 mol) of 2-hydroxy-6-naphthaldehyde as compound (M-7), and 145 g of methyl cellosolve. With stirring at 70° C., 20 g of a methyl cellosolve solution of 20 wt % p-toluenesulfonic acid was added. The solution was heated at 85° C., stirred at the temperature for 6 hours, cooled to room temperature, and diluted with 800 mL of ethyl acetate. The solution was transferred to a separatory funnel, and repeatedly washed with 200 mL of deionized water to remove the reaction catalyst and metal impurities. The solution was concentrated under reduced pressure, and 600 mL of ethyl acetate was added to the concentrate, which was poured into 2,400 mL of hexane for precipitation of the polymer. The polymer precipitate was filtered, collected, and dried in vacuum, obtaining Polymer 4 consisting of repeating units of the following structural formula. Polymer 4 was determined for Mw and Mw/Mn by GPC and for compositional ratio by $^1$H-NMR analysis.

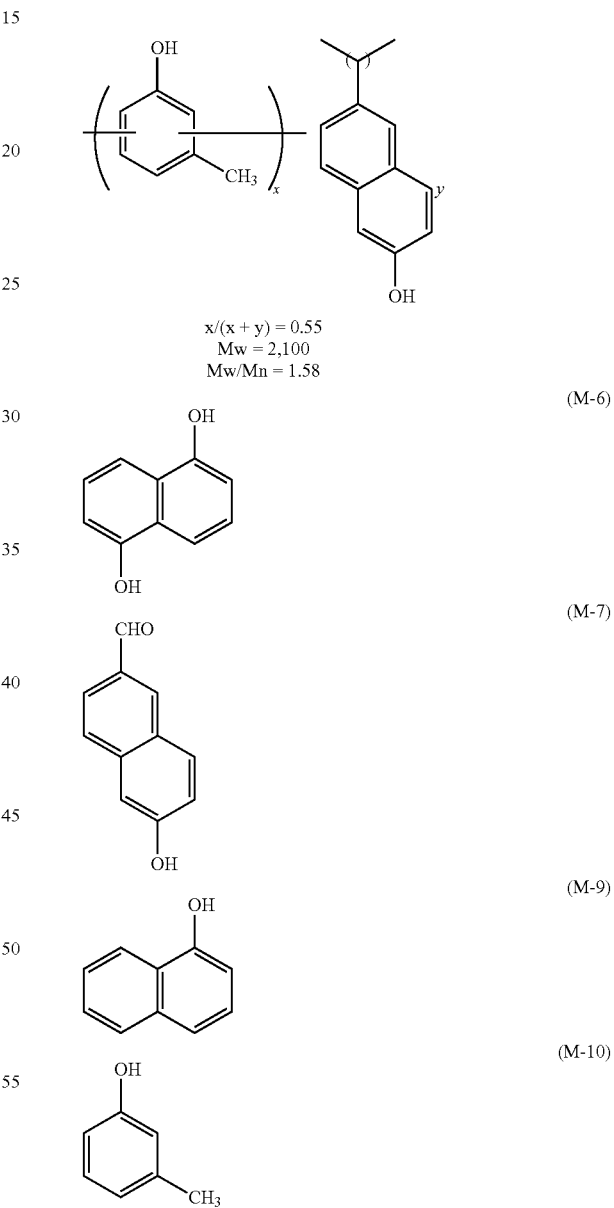

x/(x + y) = 0.55
Mw = 2,100
Mw/Mn = 1.58

Resin solutions A-1, A-2, A-3 and A-4 were prepared by dissolving 20 parts of Polymers 1, 2, 3 and 4, 1 part of acid generator AG1, and 4 parts of a crosslinker (Nikalac MW-390, Sanwa Chemical Co., Ltd.) in 100 parts of PGMEA containing 0.1 wt % of surfactant FC-430 (3M-Sumitomo Co., Ltd.) and passing through a fluoro-resin filter with a pore size of 0.1 μm. A resin solution A-1' was prepared like resin solution A-1 aside from changing the amount of PGMEA to 35 parts.

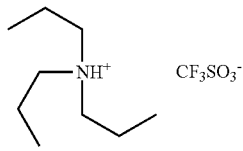

AG1

Examples 1 to 4 and Comparative Examples 1, 2

Each of resin solutions A-1, A-1', A-2, A-3 and A-4 was spin coated onto a glass plate (diameter 200 mm, thickness 500 μm) and heated on a hot plate at 250° C. for 5 minutes to form a layer at a thickness shown in Table 1 corresponding to cured resin layer (A).

Each of solutions B-1 and B-2 was spin coated on the cured resin layer (A) and heated on a hot plate at 150° C. for 5 minutes to form a cured resin layer (B) at a thickness shown in Table 1 on layer (A). Using a vacuum wafer bonder (EVG520IS by EV Group), the coated glass plate was joined to a silicon wafer (diameter 200 mm, thickness 725 μm) having copper posts (height 10 μm, diameter 40 μm) distributed over its entire surface, with the cured resin layer (B) and the copper post-bearing surface mated together, under a vacuum of less than $10^{-3}$ mbar and at a bonding temperature shown in Table 1. There was obtained a wafer laminate.

Each wafer laminate sample was examined by the following tests. The tests were carried out in the sequence described below. The results of Examples and Comparative Examples are shown in Table 1.

Adhesion Test

Using the vacuum wafer bonder (EVG520IS by EV Group), bonding of 200 mm wafer was carried out at a temperature shown in Table 1, a pressure within the chamber of less than $10^{-3}$ mbar, and a load of 5 kN.

After the bonding, the substrate was heated in an oven at 180° C. for 1 hour, causing layer (B) to be cured. Thereafter, it was cooled to room temperature. The interfacial bond state was observed with the naked eyes and under an optical microscope. The sample was evaluated good (○) when no defectives like bubbles were found at the interface, and poor (X) when defectives were found.

Back Surface Grinding Test

The back surface of the silicon wafer of the laminate was ground by a grinder (DAG810 by DISCO Co., Ltd.) having a diamond abrasive wheel. After the wafer was ground to a final thickness of 50 μm, it was observed for defectives such as cracks and dislodgment under an optical microscope (100×). The sample was evaluated good (○) when no defectives were found, and poor (X) when defectives were found.

Heat Resistance Test

After the back surface of the silicon wafer was ground, the laminate was held in an oven at 150° C. for 2 hours. The outer appearance of the laminate was observed for anomaly. The sample was evaluated good (○) when no appearance anomalies were found, and poor (X) when appearance anomalies such as void formation, wafer bulging and wafer rupture were found.

Transmittance and Light Resistance Test

Each of resin solutions A-1, A-1', A-2, A-3 and A-4 was spin coated onto a glass substrate of 500 μm thick and heat cured at 250° C. for 5 minutes to form a cured resin layer (A) of 0.3 in thick. The transmittance of the layer was measured at wavelength 500 nm using a spectrophotometer Model U-4100 (Hitachi High-Tech Science Corp.). The sample was evaluated good (○) when the transmittance was 15% or less and poor (X) when the transmittance exceeded 15%. Also an absorptivity at wavelength ≤500 nm was measured by the spectrophotometer Model U-4100. All the resin layers within the scope of the invention showed an absorptivity of at least 80% at wavelength ≤ 500 nm.

The glass substrate having cured resin layer (A) formed thereon was exposed to simulative sunlight (with wavelength ≤ 350 nm cut off) at 5,000,000 lux, after which the transmittance at wavelength 500 nm was measured again. The sample was evaluated good (○) when the transmittance was 15% or less and poor (X) when the transmittance exceeded 15%.

TABLE 1

|  | Example | | | | Comparative Example | |
|---|---|---|---|---|---|---|
|  | 1 | 2 | 3 | 4 | 1 | 2 |
| Resin solution | A-1 | A-1 | A-2 | A-3 | A-1' | A-4 |
| Layer (A) thickness, μm | 0.3 | 0.3 | 0.3 | 0.3 | 12 | 0.3 |
| Thermosetting resin composition solution | B-1 | B-2 | B-2 | B-2 | — | B-2 |
| Layer (B) thickness, μm | 60 | 60 | 60 | 60 | — | 60 |
| Bonding temperature, ° C. | 110 | 120 | 120 | 120 | — | 120 |
| Uniformity of layer (B) thickness, μm | <1 | <1 | <1 | <1 | — | <1 |
| Adhesion  Visual observation | ○ | ○ | ○ | ○ | X | ○ |
| Optical microscope | ○ | ○ | ○ | ○ | X | ○ |
| Resistance to back surface grinding | ○ | ○ | ○ | ○ | — | ○ |
| Heat resistance | ○ | ○ | ○ | ○ | — | ○ |
| Transmittance of layer (A) | ○ (7%) | ○ (7%) | ○ (12%) | ○ (9%) | ○ (<1%) | X (35%) |
| Transmittance of layer (A) after light resistance test | ○ (9%) | ○ (9%) | ○ (13%) | ○ (10%) | ○ (<1%) | X (35%) |
| Absorptivity ≥80% at wavelength ≤500 nm | ○ | ○ | ○ | ○ | ○ | X |

It is evident from Table 1 that Examples 1 to 4 within the scope of the invention ensure easy temporary bonding and peeling. In Comparative Example 1 outside the scope of the invention, after bonding, voids are detected both on visual observation and optical microscope observation. In Comparative Example 2, the transmittance of layer (A) is insufficient. It is noted that the layers of Examples 1 to 4 are capable of shielding broadband light.

It is noted that the invention is not limited to the aforementioned embodiments. While the embodiments are merely exemplary, any embodiments having substantially the same construction as the technical concept set forth in the following claims and exerting equivalent functions and results are believed to be within the spirit and scope of the invention.

Japanese Patent Application No. 2015-230407 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A wafer laminate comprising a transparent substrate, an adhesive layer formed on the substrate, and a wafer bonded to the adhesive layer, with a circuit-forming surface of the wafer facing the adhesive layer,
   the adhesive layer including a first cured resin layer (A) disposed adjacent the substrate and having light-shielding properties and a second cured resin layer (B) disposed adjacent the wafer and comprising a cured product of a thermosetting resin composition,
   wherein the first cured resin layer (A) having light-shielding properties has a transmittance of up to 15% at wavelength 500 nm and substantial absorption at wavelength up to 500 nm.

2. The wafer laminate of claim 1 wherein the second cured resin layer (B) is a cured product of a thermosetting resin composition based on a silicone resin polymer and/or epoxy resin polymer, the cured product having a resin modulus of 10 to 1,000 MPa at 25° C.

3. The wafer laminate of claim 2 wherein the thermosetting resin composition is based on a phenol-modified silicone resin and/or epoxy-modified silicone resin.

4. The wafer laminate of claim 3 wherein the thermosetting resin composition based on a phenol-modified silicone resin is a composition comprising 100 parts by weight of a phenol-modified silicone resin comprising repeating units represented by the general formula (2) and having a weight average molecular weight of 3,000 to 500,000, and 0.1 to 50 parts by weight of at least one crosslinker which is selected from epoxy compounds having on average at least two epoxy groups per molecule,

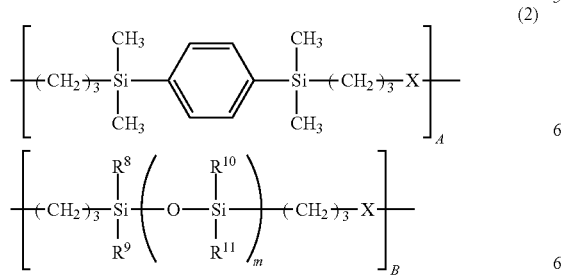

wherein $R^8$ to $R^{11}$ are each independently a $C_1$-$C_8$ monovalent hydrocarbon group, m is an integer of 1 to 100, B is a positive number, A is 0 or a positive number, A+B=1, and X is a divalent organic group having the general formula (3):

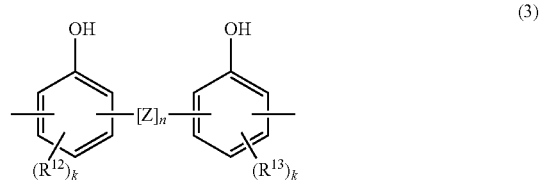

wherein Z is a divalent organic group selected from the following:

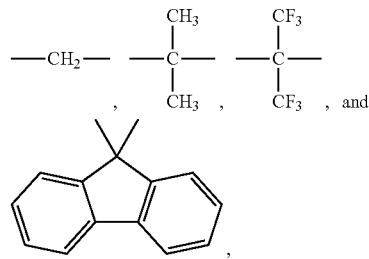

n is 0 or 1, $R^{12}$ and $R^{13}$ each are $C_1$-$C_4$ alkyl or alkoxy, and k is 0, 1 or 2.

5. The wafer laminate of claim 3 wherein the thermosetting resin composition based on an epoxy-modified silicone resin is a composition comprising 100 parts by weight of an epoxy-modified silicone resin comprising repeating units represented by the general formula (4) and having a weight average molecular weight of 3,000 to 500,000, and 0.1 to 50 parts by weight of at least one crosslinker which is selected from phenol compounds having on average at least two phenol groups per molecule and epoxy compounds having on average at least two epoxy groups per molecule,

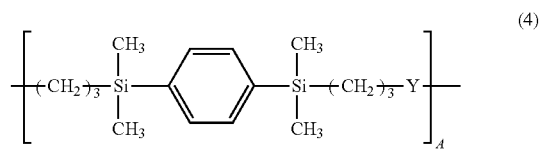

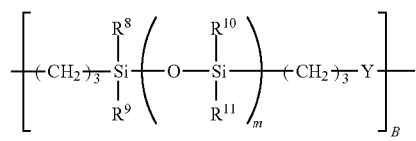

wherein $R^8$ to $R^{11}$ are each independently a $C_1$-$C_8$ monovalent hydrocarbon group, m is an integer of 1 to 100, B is a positive number, A is 0 or a positive number, A+B=1, and Y is a divalent organic group having the general formula (5):

(5)

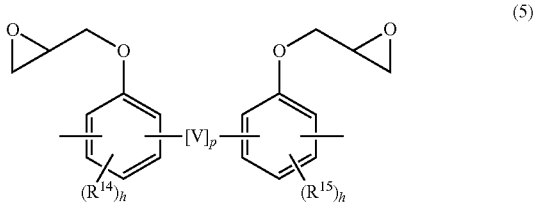

wherein V is a divalent organic group selected from the following:

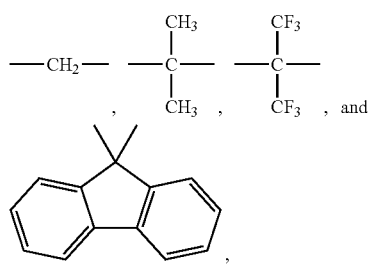

p is 0 or 1, $R^{14}$ and $R^{15}$ each are $C_1$-$C_4$ alkyl or alkoxy, and h is 0, 1 or 2.

6. The wafer laminate of claim 1 wherein the first cured resin layer (A) has a thickness of 0.1 to 30 μm, and the second cured resin layer (B) has a thickness of 1 to 200 μm.

7. A wafer laminate comprising a transparent substrate, an adhesive layer formed on the substrate, and a wafer bonded to the adhesive layer, with a circuit-forming surface of the wafer facing the adhesive layer,
the adhesive layer including a first cured resin layer (A) disposed adjacent the substrate and having light-shielding properties and a second cured resin layer (B) disposed adjacent the wafer and comprising a cured product of a thermosetting resin composition,
wherein the first cured resin layer (A) is a cured product of a resin composition comprising a polymer comprising repeating units having the general formula (1):

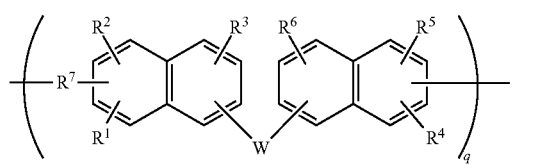

(1)

wherein $R^1$, $R^2$, $R^3$, $R^4$, $R^5$, and $R^6$ are each independently hydrogen, hydroxyl, or a $C_1$-$C_{20}$ monovalent organic group, at least one of $R^1$ to $R^3$ is hydroxyl, at least one of $R^4$ to $R^6$ is hydroxyl, $R^7$ is a single bond or a $C_1$-$C_{20}$ divalent organic group, W is a single bond or a $C_1$-$C_{30}$ divalent organic group, and q is such a natural number that the polymer has a weight average molecular weight of 500 to 500,000.

8. The wafer laminate of claim 7 wherein the resin composition of the first cured resin layer (A) further comprises at least one of a crosslinker, an acid generator and an organic solvent.

9. A method for preparing the wafer laminate of claim 1 by bonding the wafer at its circuit-forming surface to the transparent substrate through the adhesive layer, said method comprising the steps of:
(a) forming the first cured resin layer (A) having light-shielding properties or a resin composition layer (A') for forming the first cured resin layer (A) directly on the transparent substrate,
(b) forming a thermosetting resin composition layer (B') for forming the second cured resin layer (B) on the first cured resin layer (A) or resin composition layer (A'),
(c) bonding the wafer at its circuit-forming surface to the thermosetting resin composition layer (B') under a reduced pressure,
(d) heat curing the thermosetting resin composition layer (B') to form the second cured resin layer (B) and to bond it to the first cured resin layer (A), or when the resin composition layer (A') is used, simultaneously heat curing the resin composition layer (A') and the thermosetting resin composition layer (B') to form the first and second cured resin layers (A) and (B) and bond them together, and
(e) grinding or polishing a non-circuit forming surface of the wafer bonded to the substrate.

10. A method for preparing the wafer laminate of claim 1 by bonding the wafer at its circuit-forming surface to the transparent substrate through the adhesive layer, said method comprising the steps of:
(a) forming the first cured resin layer (A) having light-shielding properties or a resin composition layer (A') for forming the first cured resin layer (A) directly on the transparent substrate,
(b') forming a thermosetting resin composition layer (B') for forming the second cured resin layer (B) on the circuit-forming surface of the wafer,
(c') bonding the first cured resin layer (A) or resin composition layer (A') on the substrate and the thermosetting resin composition layer (B') on the wafer under a reduced pressure,
(d) heat curing the thermosetting resin composition layer (B') to form the second cured resin layer (B) and to bond it to the first cured resin layer (A), or when the resin composition layer (A') is used, simultaneously heat curing the resin composition layer (A') and the thermosetting resin composition layer (B') to form the first and second cured resin layers (A) and (B) and bond them together, and
(e) grinding or polishing a non-circuit-forming surface of the wafer bonded to the substrate.

* * * * *